United States Patent
Saito

(10) Patent No.: US 8,681,851 B2
(45) Date of Patent: Mar. 25, 2014

(54) ADAPTIVE FILTER

(75) Inventor: Yasuji Saito, Ota (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/537,713

(22) Filed: Jun. 29, 2012

(65) Prior Publication Data
US 2013/0002345 A1      Jan. 3, 2013

(30) Foreign Application Priority Data

Jun. 30, 2011  (JP) .................................. 2011-146302

(51) Int. Cl.
*H03H 7/30* (2006.01)

(52) U.S. Cl.
USPC ........... 375/232; 375/229; 375/230; 375/231; 333/18; 381/103; 708/303

(58) Field of Classification Search
USPC .............. 375/232, 229, 230, 231; 333/18, 28; 381/103; 708/303
See application file for complete search history.

(56) References Cited

U.S. PATENT DOCUMENTS

2009/0060167 A1 *  3/2009  Deng et al. ............... 379/406.08
2011/0305306 A1 * 12/2011  Hu et al. ....................... 375/350

FOREIGN PATENT DOCUMENTS

JP       2002261528 A     9/2002

* cited by examiner

*Primary Examiner* — Zewdu Kassa
(74) *Attorney, Agent, or Firm* — Polansky & Associates, P.L.L.C.; Paul J. Polansky

(57) ABSTRACT

An adaptive filter includes: a filter configured to perform a filtering process for an input signal with a filter coefficient set therein, and output the processed input signal as an output signal; a calculating unit configured to calculate a value indicative of an error between an amplitude of the output signal and a reference amplitude; an output unit configured to output a first constant as a parameter when the amplitude of the output signal is greater than the predetermined amplitude, the parameter used when updating the filter coefficient, and output a second constant as the parameter when the amplitude of the output signal is smaller than the predetermined amplitude; and an updating unit configured to update the filter coefficient with an update amount corresponding to the parameter and the value indicative of the error, such that the error is reduced.

5 Claims, 8 Drawing Sheets

ADAPTIVE FILTER

CROSS-REFERENCE TO RELATED APPLICATION

This application claims the benefit of priority to Japanese Patent Application No. 2011-146302, filed Jun. 30, 2011, of which full contents are incorporated herein by reference.

BACKGROUND OF THE INVENTION

1. Field of the Invention

The present invention relates to an adaptive filter.

2. Description of the Related Art

In an adaptive filter, a step size parameter μ having a great value may be used to reduce a convergence time period for a filter coefficient to converge to a proper value. However, when the step size parameter μ is unnecessarily increased in value, the filter coefficient may not consequently converge and may significantly deviate from its optimal value. Thus, the value of the step size parameter μ is determined considering the balance between whether the filter coefficient converges in value and the convergence time period (see, e.g., Japanese Laid-Open Patent Publication No. 2002-261528).

For example, an adaptive filter configured to operate based on a CMA (Constant Modulus Algorithm) has a filter coefficient whose update amount varies with not only the step size parameter μ but also the amplitude of an output signal outputted from the adaptive filter. The amplitude of the output signal outputted from the adaptive filter varies with the amplitude of an input signal inputted to the adaptive filter. Therefore, when the amplitude of the input signal inputted to the adaptive filter significantly fluctuates, it is difficult to properly control the update amount of the filter coefficient.

SUMMARY OF THE INVENTION

An adaptive filter according to an aspect of the present invention, includes: a filter configured to perform a filtering process for an input signal with a filter coefficient set therein, and output the processed input signal as an output signal; a calculating unit configured to calculate a value indicative of an error between an amplitude of the output signal and a reference amplitude; an output unit configured to output a first constant as a parameter when the amplitude of the output signal is greater than the predetermined amplitude, the parameter used when updating the filter coefficient, and output a second constant as the parameter when the amplitude of the output signal is smaller than the predetermined amplitude; and an updating unit configured to update the filter coefficient with an update amount corresponding to the parameter and the value indicative of the error, such that the error is reduced.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Adaptive Filter 10

First Embodiment

Figure 1:
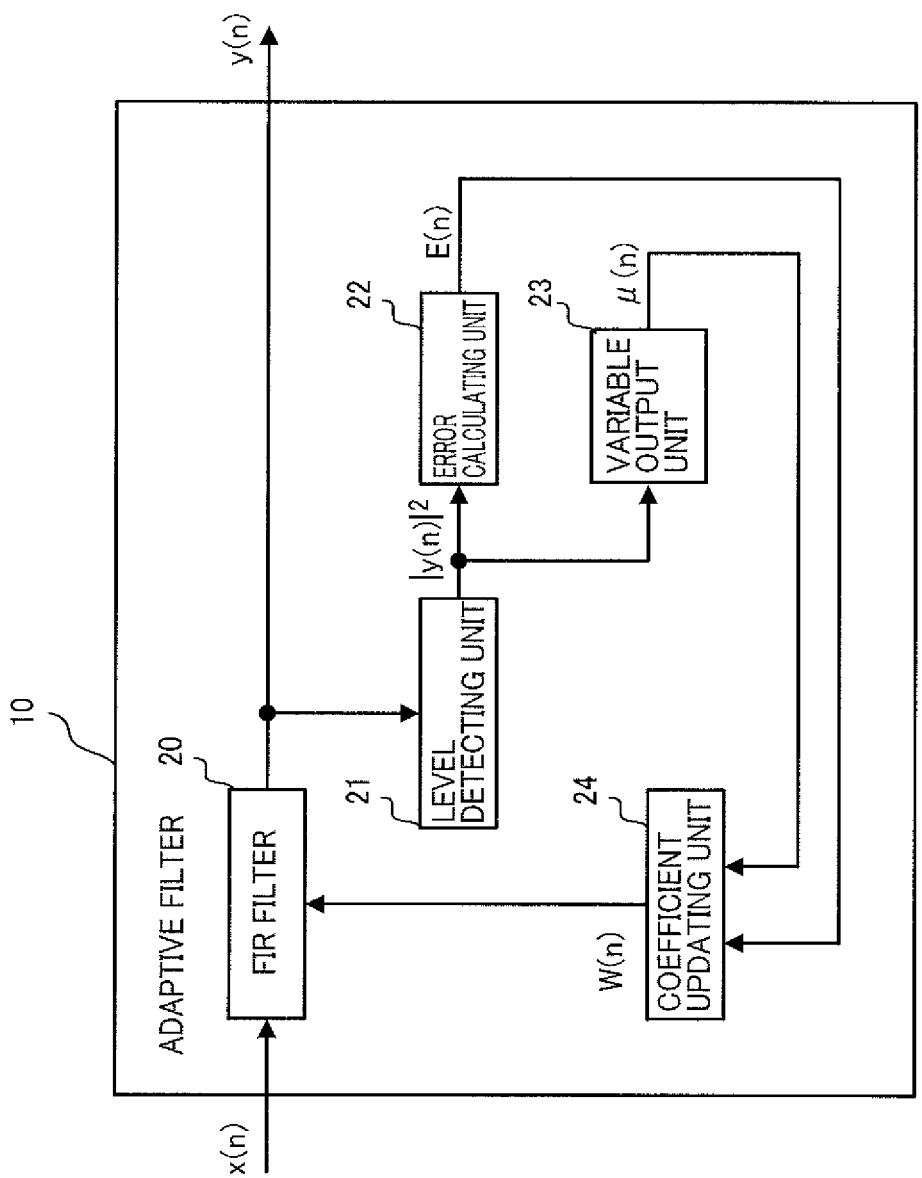
FIG. 1 is a diagram illustrating a configuration of an adaptive filter 10 according to a first embodiment of the present invention.

FIG. 1 is a diagram illustrating a configuration of an adaptive filter 10 according to a first embodiment of the present invention. The adaptive filter 10 operates based on the CMA, and updates a filter coefficient thereof such that the magnitude of the amplitude of an output signal y(n) becomes equal to the target magnitude of a reference amplitude "A". The adaptive filter 10 is realized by a DSP (Digital Signal Processor), for example, and includes an FIR (Finite Impulse Response) filter 20, a level detecting unit 21, an error calculating unit 22, a variable output unit 23, and a coefficient updating unit 24.

Figure 2:
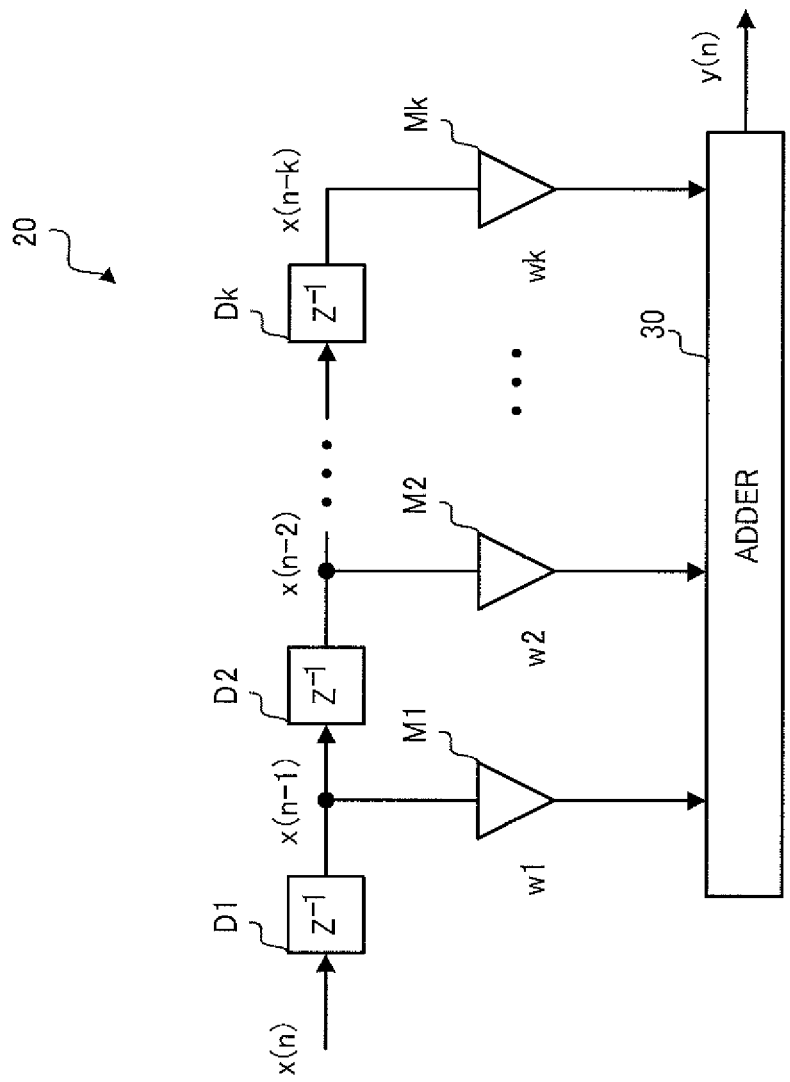
FIG. 2 is a diagram illustrating a configuration of an FIR filter 20.

As depicted in FIG. 2, the FIR filter 20 is a filter configured to execute a convolution on an input signal x(n) and a filter coefficient W(n) (W=[w1, w2, ..., wk]$^T$), and includes delay devices D1 to Dk, multipliers M1 to Mk, and an adder 30.

The delay device D1 outputs a signal x(n−1) obtained by delaying the input signal x(n) by one sampling time period. The multiplier M1 multiplies the signal x(n−1) by a filter coefficient w1, and outputs a resultant signal. The delay devices D2 to Dk are similar to the delay device D1. The multipliers M2 to Mk are similar to the multiplier M1.

The adder 30 adds up signals outputted from the multipliers M1 to Mk and outputs a resultant signal as the output signal y(n). Therefore, the output signal y(n) is expressed by Equation (1) as follows.

$$y(n) = \sum_{m=1}^{k} w_m \times x(n-m) \quad (1)$$

The level detecting unit 21 calculates a value indicative of the magnitude of the amplitude of the output signal y(n) (for example, |y(n)|).

The error calculating unit 22 (calculating unit) calculates a value indicative of an error between the amplitude of the output signal y(n) and the reference amplitude "A", as an evaluation function E(n). Specifically, the error calculating unit 22 calculates the evaluation function E(n) based on Equation (2).

$$E(n) = (|y(n)|^p - A^p)^q \quad (2)$$

In an embodiment of the present invention, it is assumed that each of "p" and "q" in Equation (2) is "two".

The variable output unit 23 (output unit) outputs a step size parameter μ(n) that corresponds to the amplitude of the output signal y(n).

The coefficient updating unit 24 (updating unit) updates the filter coefficient W(n) based on the evaluation function E(n) and the step size parameter μ(n). Specifically, the coefficient updating unit 24 updates the filter coefficient W(n) based on an algorithm of a steepest-descent method, for example, such that the value of the evaluation function E(n) becomes the smallest. On this occasion, the coefficient updating unit 24 calculates the filter coefficient W(n) based on Equation (3), for example.

$$W(n+1) = W(n) - \mu(n) \begin{bmatrix} \frac{\partial E(n)}{\partial w1} \\ \vdots \\ \frac{\partial E(n)}{\partial wk} \end{bmatrix} \quad (3)$$

Here, when substituting Equation (2) where p=2 and q=2 into Equation (3), Equation (4) is obtained.

$$W(n+1)=W(n)-4\mu x(n)y^*(n)(|y(n)|^2-A^2) \quad (4)$$

In Equation (4), y*(n) is a complex conjugate number of y(n). As is clear from Equation (4), the update amount (W(n+1)−W(n)) of the filter coefficient W(n) increases as the step size parameter μ(n) increases. As such, the relationship of Equation (1) is established between the output signal y(n) and the input signal x(n). Therefore, even if the value of the step size parameter μ(n) is constant, for example, when the amplitude of the input signal x(n) increases and a value (|y(n)|²−A²) indicative of the error increases, the update amount of the filter coefficient also increases.

==Details of Variable Output Unit 23==

Figure 3:
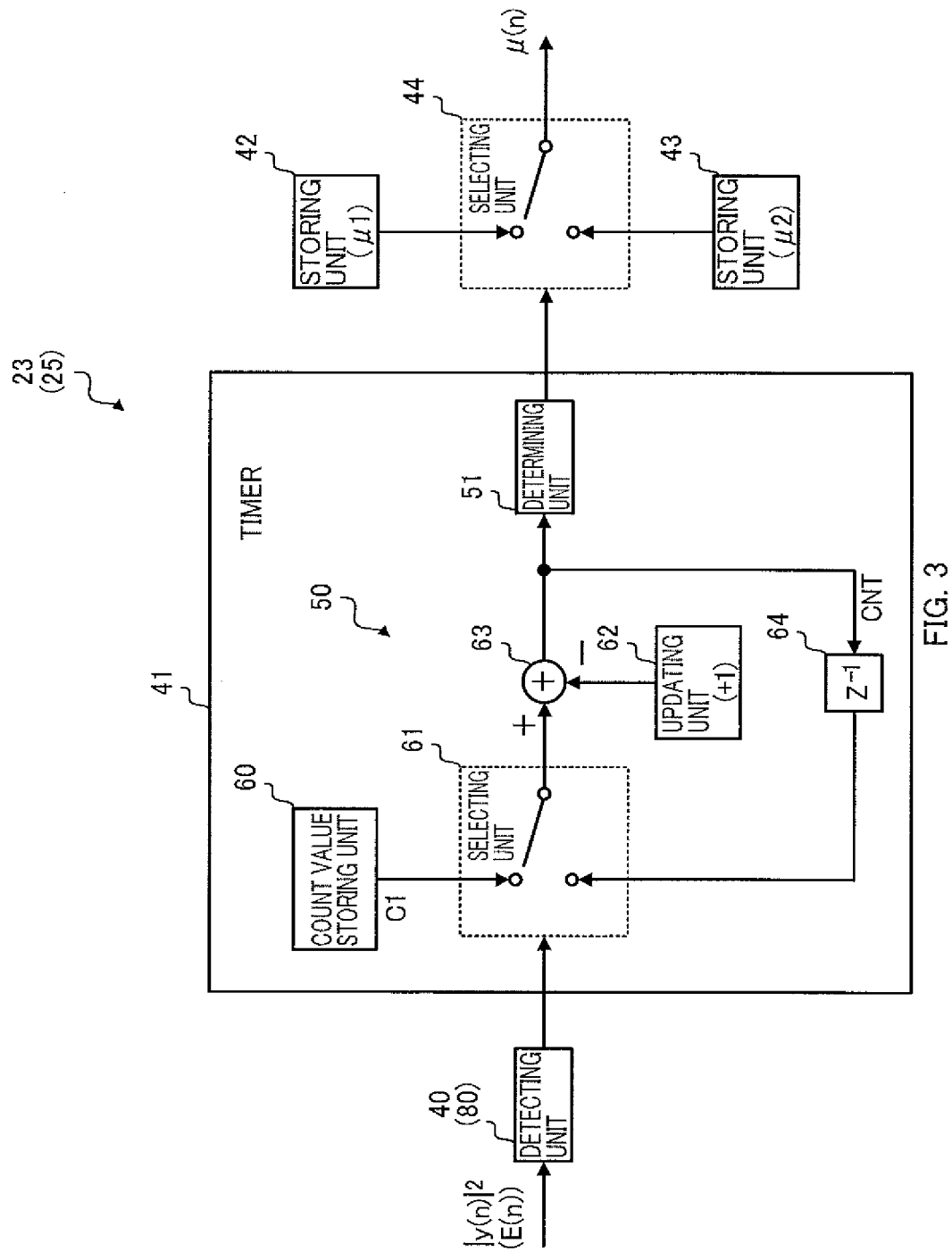
FIG. 3 is a diagram illustrating a configuration of a variable output unit 23.

The details of the variable output unit 23 will be described with reference to FIG. 3. The variable output unit 23 includes a detecting unit 40, a timer 41, storing units 42 and 43, and a selecting unit 44. The timer 41, the storing units 42 and 43, and the selecting unit 44 are equivalent to a parameter output unit.

The detecting unit 40 detects whether the amplitude of the output signal y(n) is greater than the predetermined amplitude B (>the reference amplitude A) based on the value |y(n)|² indicative of the magnitude of the amplitude of the output signal y(n).

The timer 41 determines whether the predetermined time period TA has elapsed from the time when the detecting unit 40 detects that the amplitude of the output signal y(n), which was greater than the predetermined amplitude B, decreases and becomes smaller than the predetermined amplitude B. The timer 41 includes a counting unit 50 and a determining unit 51.

The counting unit 50 updates (for example, decrements) a set count value CNT every sampling time period. The counting unit 50 includes a count value storing unit 60, a selecting unit 61, an updating unit 62, an adder 63, and a delay device 64.

The count value storing unit 60 has the predetermined count value C1 stored therein. The selecting unit 61 selects the count value C1 stored in the count value storing unit 60 and outputs the count value C1 to the adder 63 when it is detected that the amplitude of the output signal y(n) is greater than the predetermined amplitude B. The selecting unit 61 outputs the count value CNT stored in the delay device 64 to the adder 63 when it is detected that the amplitude of the output signal y(n) is smaller than the predetermined amplitude B.

The updating unit 62 and the adder 63, every sampling time period, subtract (decrement) "one" from the count value outputted from the selecting unit 61, and store the resultant count value in the delay device 64.

Therefore, the counting unit 50 is set at a count value C1-1 (first predetermined value) as the count value CNT every time it is detected that the amplitude of the output signal y(n) is greater than the predetermined amplitude B.

The determining unit 51 determines whether the count value CNT is decremented from the count value C1-1 and reaches the predetermined count value C2 (second predetermined value). It is assumed that the time period until the time when the count value CNT to reach the count value C2 by being decremented from the count value C1-1 by one every decrement is the predetermined time period TA.

The storing units 42 and 43 have step size parameters μ1 and μ2 stored therein, respectively. The relationship between the values of the step size parameters μ1 (first constant) and μ2 (second constant) will be described later.

The selecting unit 44 selects and outputs the step size parameter μ1 when the count value CNT is smaller than the count value C1 that is greater than the count value C2, that is, during a time period from the time when the amplitude of the output signal y(n) decreases and becomes smaller than the predetermined amplitude B to the time when the predetermined time period TA has elapsed therefrom. The selecting unit 44 selects and outputs the step size parameter μ2 when the count value CNT is equal to or smaller than the count value C2, that is, for example, when the predetermined time period TA has elapsed from when the amplitude of the output signal y(n) becomes smaller than the predetermined amplitude B. In an embodiment of the present invention, it is assumed that the initial value of the count value CNT is the count value C2. Therefore, when the adaptive filter 10 is started, the step size parameter μ2 is selected and outputted.

==Updating of Filter Factor W(n) (When μ1<μ2)==

An update amount of the filter coefficient W(n) will be described for the case where the amplitude of the input signal X(n) increases on the condition that the value of the step size parameter μ2 usually used is great to some extent and is greater than the step size parameter μ1.

Figure 4:
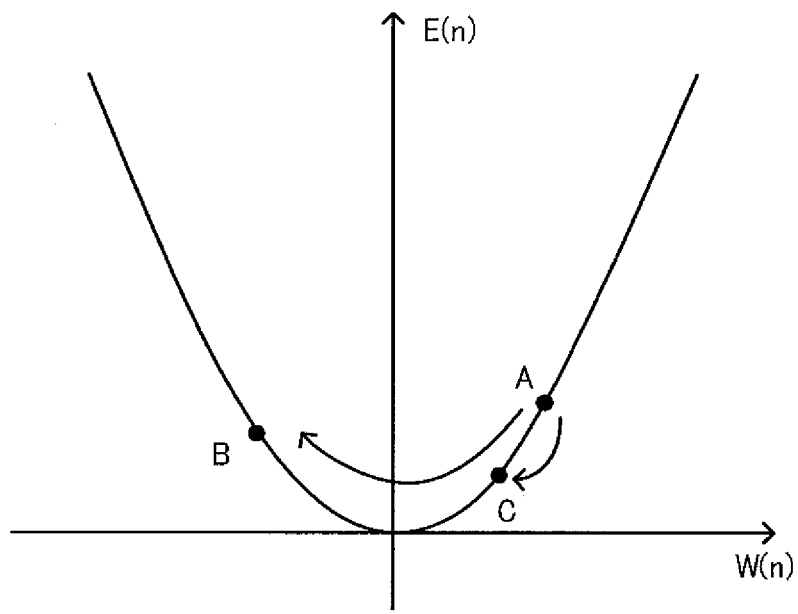
FIG. 4 is a diagram for explaining updating of a filter coefficient W(n) when "μ1" is greater than "μ2"

Here, a description will be made using the evaluation function E(n) where p=1 and q=2 for convenience sake. The evaluation function E(n) where p=1 and q=2 is a quadratic function of the filter coefficient W(n), as is clear from the relationship of Equations (1) and (2). Therefore, the relationship between the evaluation function E(n) and the filter coefficient W(n) is expressed as a downwardly convex quadric curve as depicted in FIG. 4, for example. Furthermore, in FIG. 4, the origin point is set at a point at which the evaluation function E(n) is the minimum (optimum point) for convenience sake.

For example, when the current filter coefficient W(n) is a coefficient determined at "A point", that is, when "A point" is present in the positive region, the slope of the evaluation function E(n) at "A point" is positive as is clear from Equation (3). Therefore, the update amount of the filter coefficient W(n) is a negative value and the filter coefficient W(n) is updated toward the optimum point (origin point).

Here, in the case where the filter coefficient W(n) is the coefficient determined at "A point", when the amplitude of the input signal x(n) becomes greater than the predetermined amplitude B, the value indicative of the error (|y(n)|−A) in Equation (4) also increases as described above. In this case, when μ2 (>μ1) having a great value continues to be tentatively used as the step size parameter μ(n), the update amount increases and the filter coefficient W(n+1) may move from "A point" to "B point", for example, passing the origin point. That is, the filter coefficient W(n) becomes difficult to converge.

However, in this case, when the amplitude of the input signal x(n) becomes greater than the predetermined amplitude B, μ1 having a small value is used as the step parameter μ(n). Therefore, in this case, it is suppressed that the update amount unnecessarily increases. Therefore, as depicted in FIG. 4, the filter coefficient W(n+1) moves from "A point" to "C point", for example, which enables the filter coefficient W(n+1) to approach the origin point that is the optimum point in a more stable manner.

==Updating of Filter Factor W(n) (When μ1>μ2)==

An update amount of the filter coefficient W(n) will be described for the case where the amplitude of the input signal X(n) increases on the condition that the value of the step size parameter μ2 usually used is small to some extent and is smaller than the step size parameter μ1.

Figure 5:
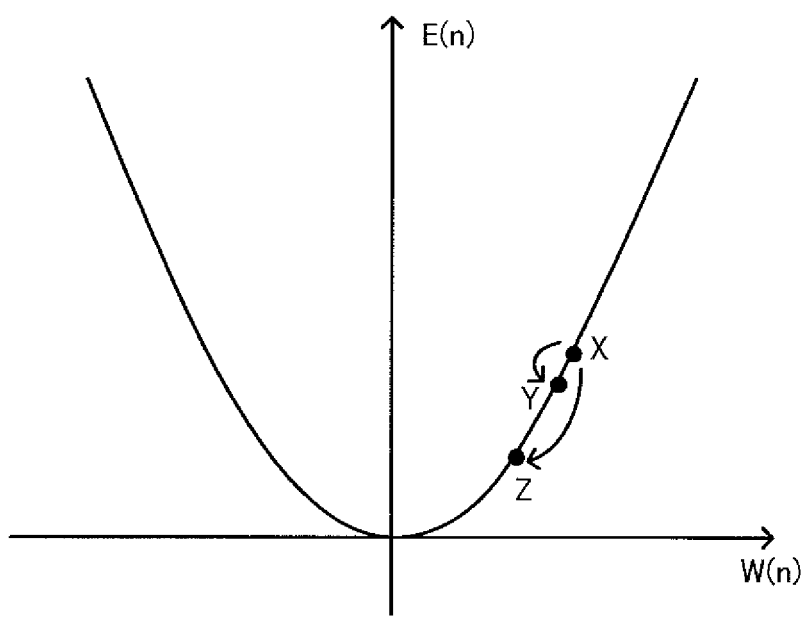
FIG. 5 is a diagram for explaining updating of the filter coefficient W(n) when "μ1" is greater than "μ2"

Here, in the case where the filter coefficient W(n) is a coefficient that is determined at "X point" of FIG. 5, when the amplitude of the input signal x(n) becomes greater than the predetermined amplitude B, the value (|y(n)|−A) indicative of the error also increases as describes above. When μ2 (<μ1) having a small value continues to be tentatively used as the step parameter μ(n), the update amount remains small. Therefore, the filter coefficient W(n+1) may only move from "X point" to "Y point" that is close to "X point", for example. That is, the convergence time period of the filter coefficient W(n) may become very long.

However, in this case, μ1 having a great value is used as the step parameter μ(n) when the amplitude of the input signal x(n) becomes greater than the predetermined amplitude B. Therefore, in this case, the update amount can be increased. As depicted in FIG. 5, the filter coefficient W(n+1) moves from "X point" to "Z point", for example, which enables the filter coefficient W(n+1) to approach the origin point that is the optimum point in a quicker manner.

It should be noted that the description has been made using the evaluation function E(n) where p=1 and q=2 for convenience sake in the above, but the same applies to the case where p=2 and q=2.

<<<Application of Adaptive Filter 10>>>

Figure 6:
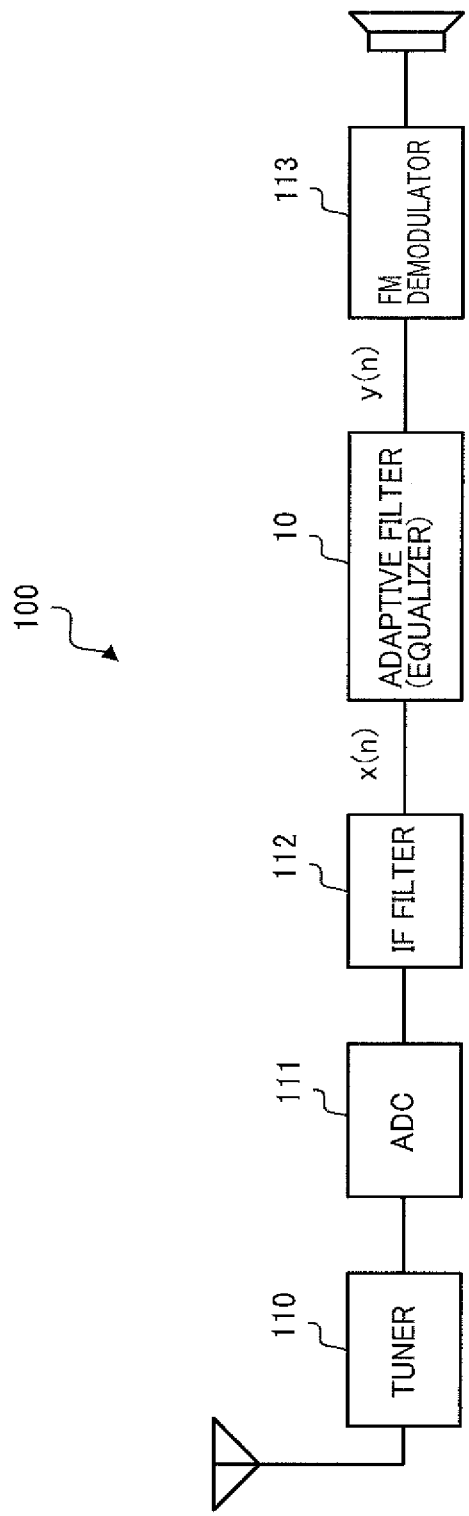
FIG. 6 is a diagram illustrating a configuration of an FM radio receiver 100 using an adaptive filter 10 as an equalizer.

FIG. 6 is a diagram illustrating the configuration of an FM radio receiver 100 applied with the adaptive filter 10 of FIG. 1 as an equalizer.

The FM radio receiver 100 includes the adaptive filter 10, a tuner 110, an AD converter 111, an IF filter 112, and an FM demodulator 113.

The tuner 110 produces an IF (Intermediate Frequency) signal at an intermediate frequency from a broadcast signal received through an antenna.

The AD converter (ADC: Analog Digital Converter) 111 digitizes the IF signal. The IF filter 112 selects and outputs a signal (channel) in a desired frequency band from the signal outputted from the AD converter 111.

The adaptive filter 10 equalizes the signal outputted from the IF filter 112 (hereinafter, referred to as "input signal X(n)") and outputs the equalized signal. Specifically, the adaptive filter 10 updates the filter coefficient W(n) such that the amplitude of the output signal y(n) becomes constant. The FM demodulator 113 demodulates the output signal y(n) and reproduces the demodulated signal using a speaker.

==Operation of Adaptive Filter 10 when Multipath Occurs==

Figure 7:
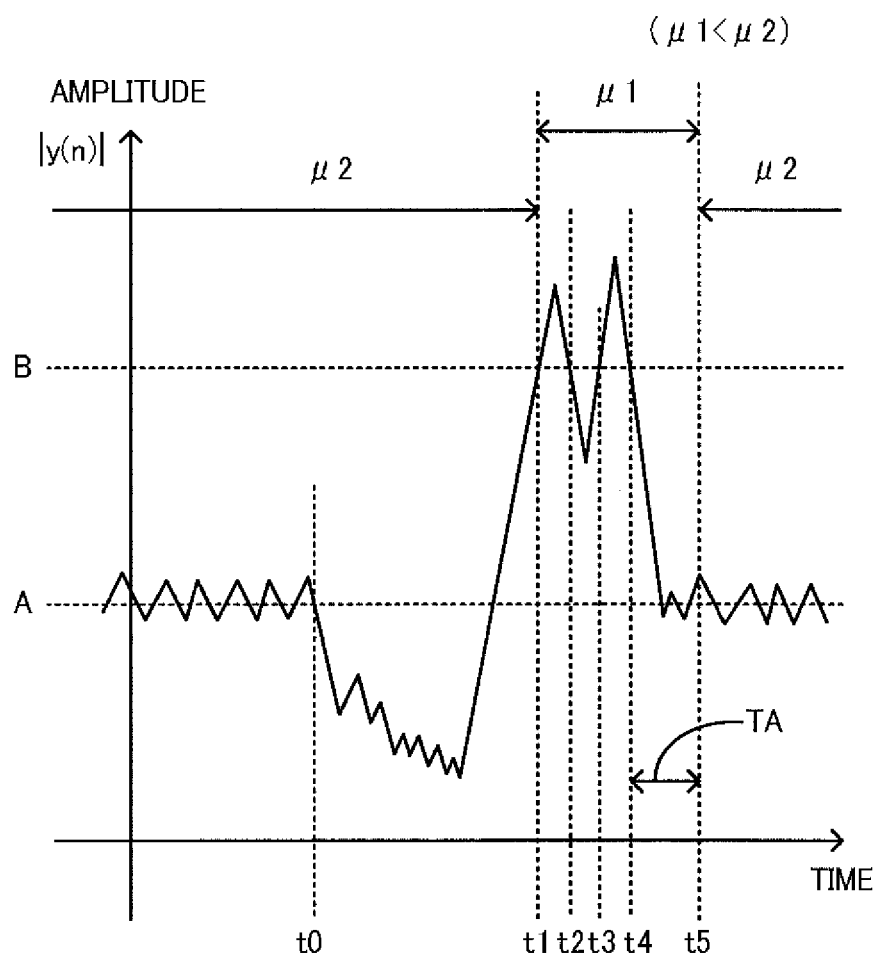
FIG. 7 is a diagram for explaining an operation of an adaptive filter 10 (equalizer) when multipath occurs.

A description will be given of an operation of the adaptive filter 10 when multipath occurs during a time period from a time t0 to around a time t4, for example, (a time period between the times t4 and t5, for example) with reference to FIG. 7. In FIG. 7, the axis of ordinate represents a value |y(n)| indicative of the magnitude of the amplitude of the output signal y(n) and the axis of abscissas represents the time. In this case, it is assumed that the value of the step size parameter μ1 is smaller than the value of the step size parameter μ2.

For example, when the multipath occurs at the time t0, the amplitude of the IF signal fluctuates which should be originally constant. Therefore, the amplitudes of the input signal X(n) and the output signal y(n) also fluctuate associated with the fluctuation of the amplitude of the IF signal.

When the amplitude of the output signal y(n) becomes greater than the predetermined amplitude B at a time t1, the step size parameter μ1 (<μ2) is outputted. Therefore, variation of the update amount of the filter coefficient W(n) is suppressed even when the amplitude of the input signal X(n) increases.

The amplitude of the output signal y(n) becomes smaller than the predetermined amplitude B at a time t2. However, at a time t3 at the time when the predetermined time period TA does not elapse from the time t2, the amplitude of the output signal y(n) again becomes greater than the predetermined amplitude B. Therefore, the step size parameter μ1 having the small value continues being outputted.

Thereafter, the influence of the multipath becomes weak. The amplitude of the output signal y(n) becomes smaller than the predetermined amplitude B at a time t4. At a time t5 after the predetermined time period TA has elapsed from the time t4, the step size parameter μ2 having the great value is outputted.

As a result, the adaptive filter 10 is able to update the filter coefficient W(n) in a stable manner even during the occurrence of the multipath. The influence of the multipath is suppressed since the adaptive filter 10 updates the filter coefficient W(n) such that the amplitude of the output signal y(n) becomes constant.

Adaptive Filter 15

Second Embodiment

Figure 8:
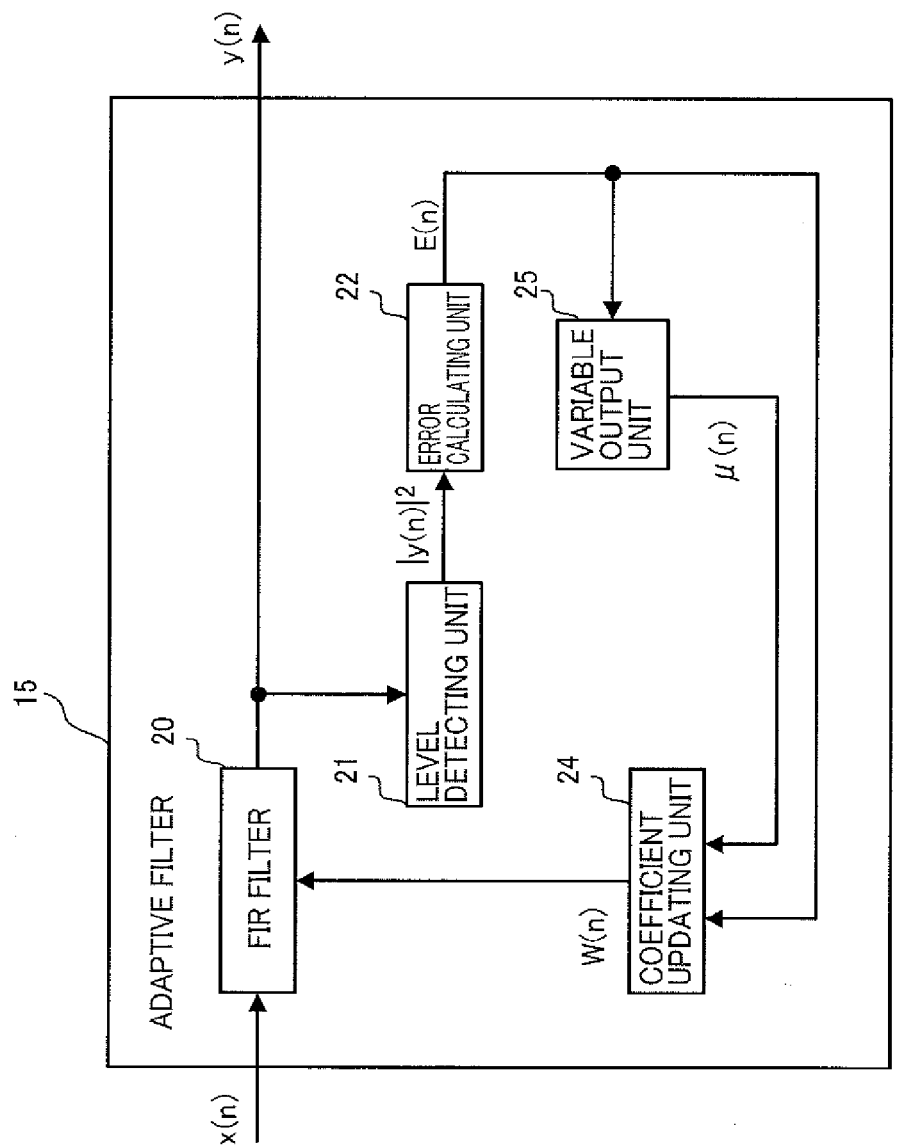
FIG. 8 is a diagram illustrating a configuration of an adaptive filter 15 according to a second embodiment of the present invention.

FIG. 8 is a diagram illustrating the configuration of an adaptive filter 15 according to a second embodiment of the present invention. Comparing the adaptive filter 15 with the adaptive filter 10 of FIG. 1, the configurations thereof are similar except for a variable output unit 25.

The variable output unit 25 (output unit) outputs a value indicative of an error based on the value of the evaluation function E(n) and the step size parameter μ(n) that corresponds to the amplitude of the output signal y(n). The variable output unit 25 uses a detecting unit 80 in place of the detecting unit 40 of the variable output unit 23 as depicted in FIG. 3, for example. Comparing the variable output unit 25 with the variable output unit 23, the configurations thereof are similar except for the detecting unit 80 denoted by a bracketed reference numeral in FIG. 3.

The detecting unit 80 determines whether the value of the evaluation function E(n) is greater than the predetermined value C when the amplitude of the output signal y(n) reaches the predetermined amplitude B.

The configuration of the variable output unit 25 except for the detecting unit 80 is similar to that of the variable output unit 23, and therefore the selecting unit 44 selects and outputs the step size parameter μ1 from the time when the amplitude of the output signal y(n) becomes smaller than the predetermined amplitude B to the time when the predetermined time period TA has elapsed. The selecting unit 44 selects and outputs the step size parameter μ2 when the predetermined time period has elapsed after the amplitude of the output signal y(n) becomes smaller than the predetermined amplitude B, for example.

==Operation of Adaptive Filter 15==

Figure 9:
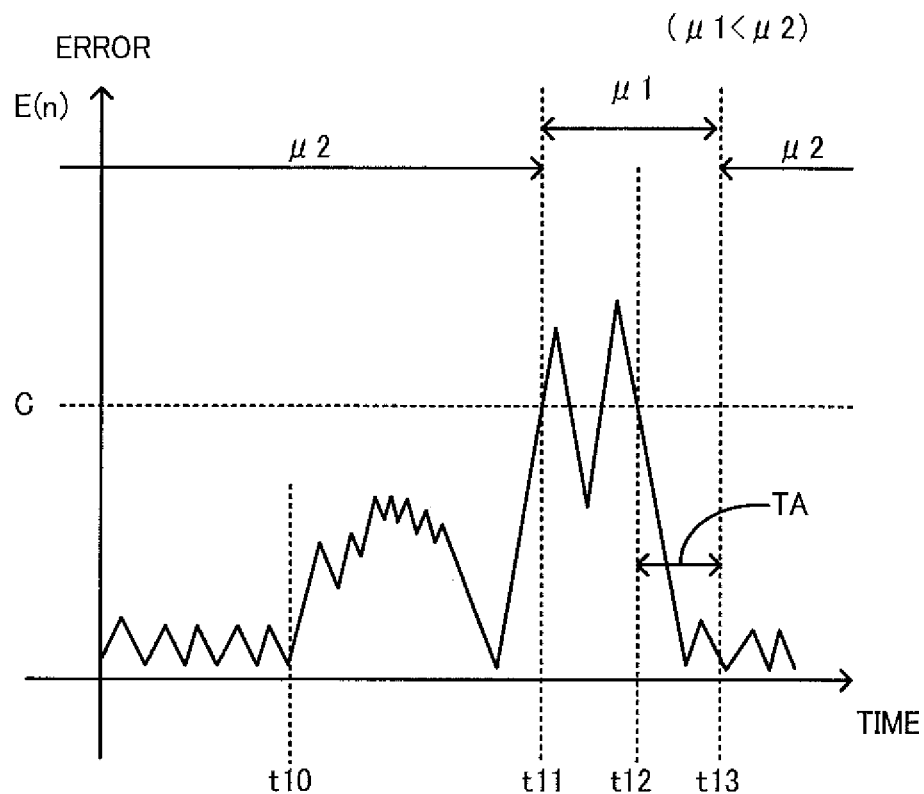
FIG. 9 is a diagram for explaining an operation of an adaptive filter 15 (equalizer) when multipath occurs.

FIG. 9 is a diagram for explaining an operation of the adaptive filter 15 executed when the adaptive filter 15 is used as an equalizer in the FM radio receiver 100. In this case, it is assumed that multipath occurs during a time period from a time t10 to around a time t12, for example (a time period between times t12 and t13 for example). In FIG. 9, the axis of ordinate represents the value of the evaluation function E(n) (the value indicative of the error) and the axis of abscissas represents the time. In this case, it is assumed that the value of the step size parameter μ1 is smaller than the value of the step size parameter μ2 usually used.

For example, when the multipath occurs at the time t10, the amplitude of the input signal X(n) significantly fluctuates. When the value of the evaluation function E(n) becomes greater than the predetermined value C at a time t11, the step size parameter μ1 (<μ2) is outputted. Therefore, variation of the update amount of the filter coefficient W(n) is suppressed even when the amplitude of the input signal X(n) increases.

During a time period from the time t11 to the time t12, although the value of the evaluation function E(n) fluctuates, the predetermined time period TA does not elapse from the time when the value of the evaluation function E(n) has become smaller than the predetermined value C. Therefore, during this time period, the step size parameter μ1 having the small value continues being outputted. Then, for example, the influence of the multipath becomes weak, and at a time t13 when the predetermined time period TA has elapsed from the time t12 at which the value of the evaluation function E(n) has become smaller than the predetermined value C, the step size parameter μ2 having the great value is outputted.

As a result, the adaptive filter 15 is able to update the filter coefficient W(n) in a stable manner even during the occurrence of the multipath. The influence of the multipath is suppressed since the filter coefficient W(n) is updated such that the amplitude of the output signal y(n) becomes constant.

The adaptive filters 10 and 15 according to embodiments of the present invention have been described. The adaptive filter 10 outputs the step size parameter μ2 when the amplitude of the input signal X(n) is small and that of the output signal y(n) is also small, and outputs the step size parameter μ1 when the amplitude of the input signal X(n) increases and that of the output signal y(n) also increases. Therefore, the adaptive filter 10 is able to properly control the update amount of the filter coefficient W(n) even when the amplitude of the input signal significantly fluctuates.

For example, the filter coefficient W(n) is able to converge in a stable manner by reducing the value of the step size parameter μ1 at a value smaller than the value of the step size parameter μ2.

When the step size parameter μ2 is outputted immediately after the amplitude of the output signal y(n) decreases and becomes smaller than the predetermined amplitude B, in the case where the amplitude of the output signal y(n) significantly fluctuates in a short time period, the update amount of the filter coefficient W(n) may become unstable and may not converge. In embodiments of the present invention, the step size parameter μ2 is outputted after the predetermined time period TA has elapsed from the time when the amplitude of the output signal y(n) has become smaller than the predetermined amplitude B. Therefore, for example, even when the amplitude of the output signal y(n) significantly fluctuates in a short time period due to the influence of the multipath, etc., the filter coefficient W(n) can be updated in a stable manner.

Further, since the predetermined time period TA is determined based on the count values C1 and C2, the predetermined time period TA can be easily varied.

The adaptive filter 15 varies the value of the step size parameter μ(n) based on the value of the evaluation function E(n) indicative of the error. Even in this case, the update amount of the filter coefficient W(n) can be properly controlled.

In embodiments of the present invention, the steepest-descent method is used as the algorithm to update the filter coefficient W(n). However, another algorithm may be used such as Marquardt Method (non-linear least square algorithm).

Although it is assumed that "p" and "q" is set at two in the evaluation function E(n), other values (for example, p=2 and q=1) may be used.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. An adaptive filter comprising:
    a filter configured to perform a filtering process for an input signal with a filter coefficient set therein, and output the processed input signal as an output signal;
    a calculating unit configured to calculate a value indicative of an error between an amplitude of the output signal and a reference amplitude;
    an output unit configured to
        output, when the amplitude of the output signal is greater than a predetermined amplitude, a first constant as a parameter used to update the filter coefficient, and
        output, when the amplitude of the output signal is smaller than the predetermined amplitude, a second constant as the parameter; and
    an updating unit configured to update the filter coefficient with an update amount corresponding to the parameter and the value indicative of the error so as to reduce the error.

2. The adaptive filter of claim 1, wherein
    the first constant is smaller in value than the second constant.

3. The adaptive filter of claim 2, wherein
    the output unit includes:
        a detecting unit configured to detect whether the amplitude of the output signal is greater than the predetermined amplitude or not; and
        a parameter output unit configured to, based on a detection result of the detecting unit,
            output the first constant as the parameter from a time when the amplitude of the output signal has become smaller than the predetermined amplitude until a time when the predetermined time period has elapsed, and
            output the second constant as the parameter when the predetermined time period has elapsed from the time when the amplitude of the output signal has become smaller than the predetermined amplitude.

4. The adaptive filter of claim 3, wherein
the parameter output unit includes:
a storing unit configured to store the first and the second constants;
a counting unit configured to update a count value at predetermined time intervals, the counting unit having a first predetermined value set therein as the count value every time the detecting unit outputs a detection result indicating that the amplitude of the output signal is greater than the predetermined amplitude; and
a selecting unit configured to
select and output the first constant during the predetermined time period from a time when the count value of the counting unit has reached the first predetermined value until a time when the count value has reached a second predetermined value, and
select and output the second constant when the count value of the counting unit has reached the second predetermined value.

5. The adaptive filter of claim 1, wherein
the output unit includes:
a detecting unit configured to detect whether or not a predetermined value when the amplitude of the output signal has reached the predetermined amplitude is greater than the value indicative of the error; and
a parameter output unit configured to
output the first constant as the parameter when the detecting unit detects that the value indicative of the error is greater than the predetermined value, and
output the second constant as the parameter when the detecting unit detects that the value indicative of the error is smaller than the predetermined value.

* * * * *